United States Patent [19]

Aoyama

[11] Patent Number: 5,317,536
[45] Date of Patent: May 31, 1994

[54] DUAL-PORT TYPE SEMICONDUCTOR INTEGRATED MEMORY CIRCUIT

[75] Inventor: Keizo Aoyama, Kawasaki, Japan
[73] Assignee: Fujitsu Limited, Kawasaki, Japan
[21] Appl. No.: 840,127
[22] Filed: Feb. 24, 1992

[30] Foreign Application Priority Data

Feb. 22, 1991 [JP] Japan .................................. 3-50545

[51] Int. Cl.⁵ .............................................. G11C 7/00
[52] U.S. Cl. ........................... 365/189.04; 365/230.01; 365/230.05
[58] Field of Search ................ 365/189.04, 230.05, 365/230.01, 190, 230.06

[56] References Cited

U.S. PATENT DOCUMENTS

| | | | |
|---|---|---|---|
| 4,541,076 | 9/1985 | Bowers et al. | 365/230.05 X |
| 4,764,899 | 8/1988 | Lewallen et al. | 365/189 |
| 5,036,491 | 7/1991 | Yamaguchi | 365/189.04 X |
| 5,062,081 | 10/1991 | Runaldue | 365/189.04 X |

FOREIGN PATENT DOCUMENTS 0149049 11/1984 European Pat. Off.
0323648 12/1988 European Pat. Off.

Primary Examiner—Eugene R. LaRoche
Assistant Examiner—Son Dinh
Attorney, Agent, or Firm—Staas & Halsey

[57] ABSTRACT

A dual-port memory circuit includes a memory cell having a pair of nodes, a first port having a first pair of bit lines and a first word line connected to said memory cell, and a second port having a second pair of bit lines and a second word line connected to said memory cell. A detection circuit detects that data is written from one of the first and second ports in a state where the memory cell is selected by both the first and second ports. A control circuit decreases a potential of one of the nodes in response to a detection output of the detection circuit.

19 Claims, 9 Drawing Sheets

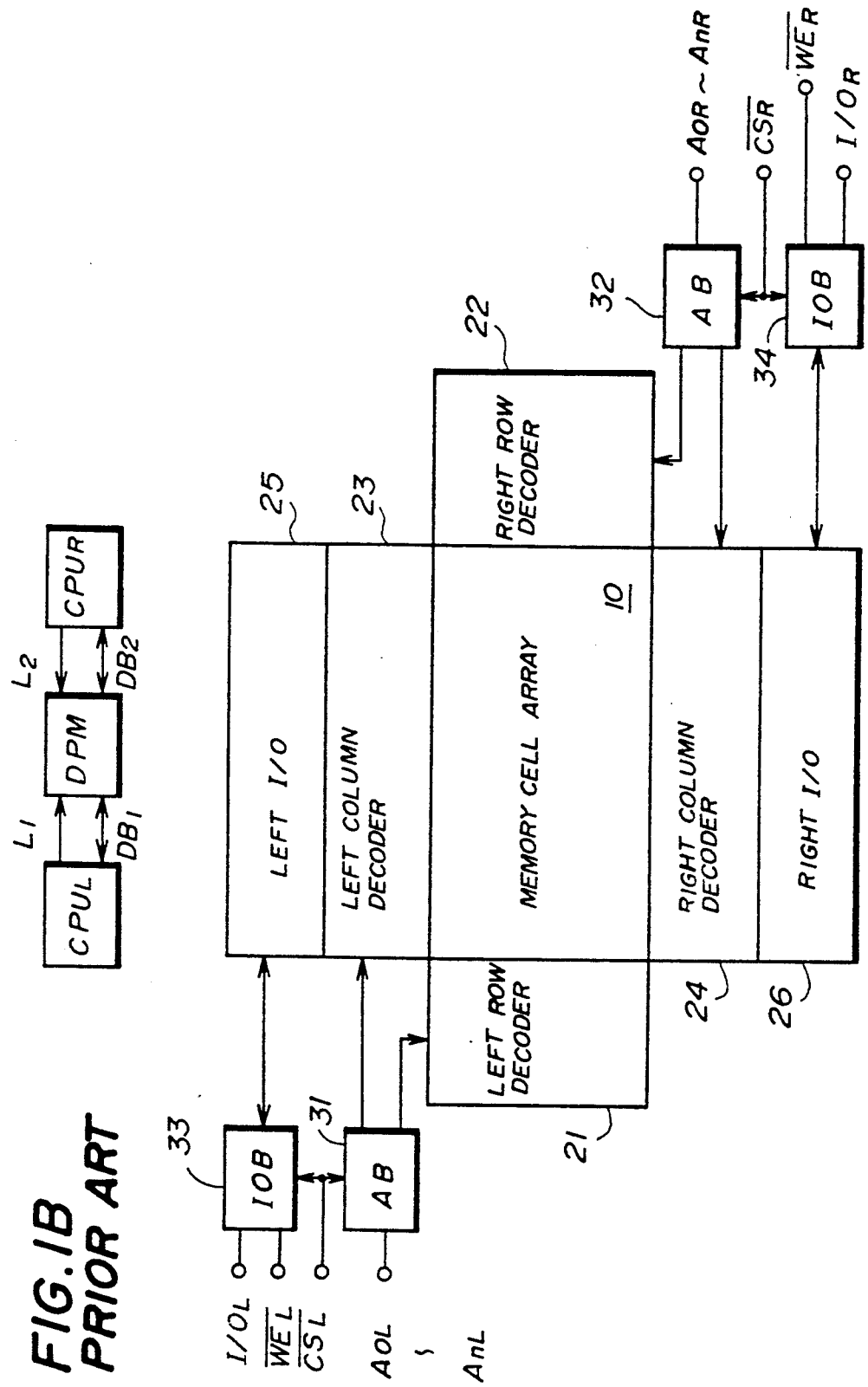

FIG. IC PRIOR ART
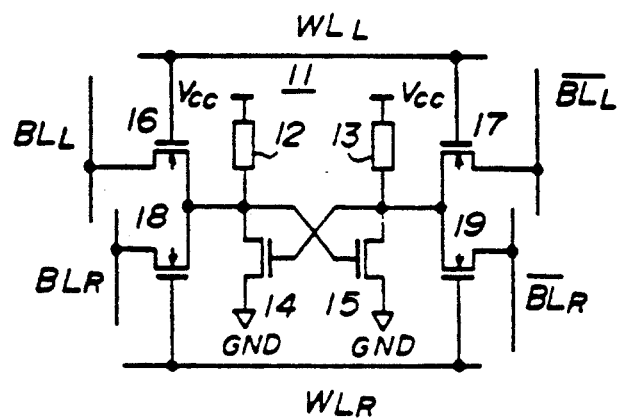
FIG. ID PRIOR ART
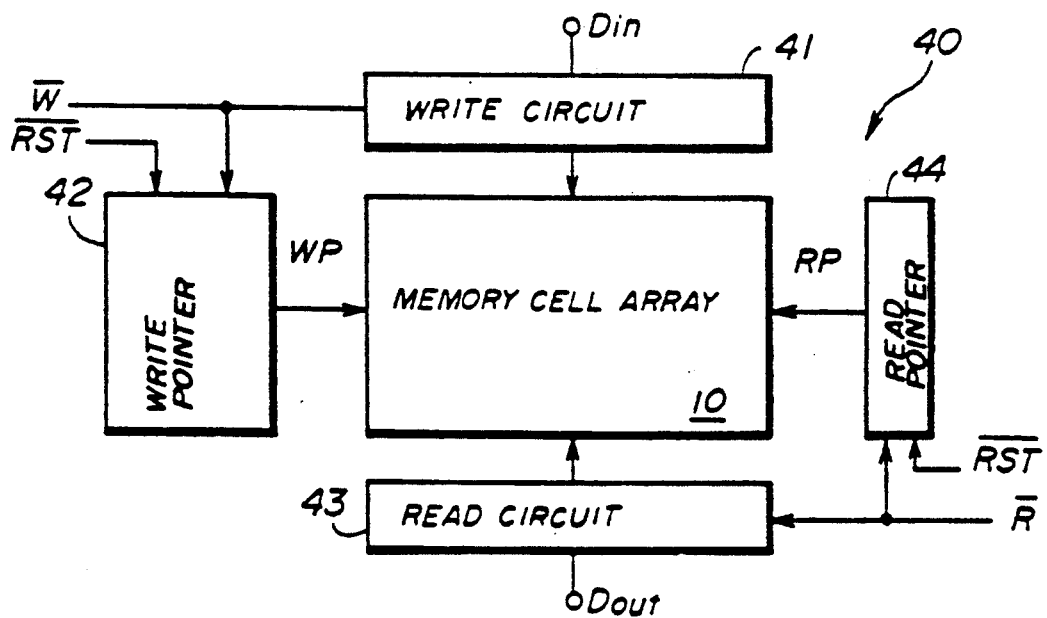

DUAL-PORT TYPE SEMICONDUCTOR INTEGRATED MEMORY CIRCUIT

BACKGROUND OF THE INVENTION (1) Field of the Invention

The present invention generally relates to semiconductor integrated storage devices, and more particularly to a dual-port type semiconductor integrated memory circuit.

(2) Description of the Prior Art

There is an increasing need for improvements in the functions and performance of electronic devices. The cost of semiconductor integrated circuit chips has become cheaper and cheaper. As a result, in many cases, a plurality of CPUs (Central Processing Units) are installed in a system in which an entire load of the system is decentralized to the CPUs. In such a system, a dual-port memory is widely used. The dual-port memory has a write port and a read port, and examples thereof are a first-in first-out memory (FIFO) memory and a last-in first-out memory (LIFO).

FIG. 1A is a block diagram of a conventional system having a dual-port memory. As shown in FIG. 1A, a dual-port memory DPM is interposed between two CPUs, labeled $CPU_L$ and $CPU_R$, and used in common thereto. THe dual-port memory DPM receives address control information and read/write control information from the $CPU_L$ via a control line L1, and sends and reads data to and from the $CPU_L$ via a data bus DB1. Simultaneously, the dual-port memory DPM receives address control information and read/write control information from the $CPU_R$ via a control line L2, and sends and reads data to and from the $CPU_R$ via a data bus DB2. During the above operation, the two CPUs can independently access the dual-port memory DPM without recognizing each other.

The system shown in FIG. 1A is applied to, for example, an instrument. In this case, a peripheral device for use in the instrument is connected to the $CPU_L$, which receives data from the peripheral device and writes the data into the dual-port memory DPM. A peripheral device used to output the measured data is connected to the $CPU_R$, which processes the data read out from the dual-port memory DPM and outputs it to the peripheral device. In this manner, the entire process comprising of the measurement process and the output process are shared by the two CPUs, and hence each of the CPUs processes a reduced load at an increased speed.

FIG. 1B is a block diagram of the dual-port memory DPM shown in FIG. 1A. Individual circuits other than a memory cell array 10 are separately provided with a left port and a right port. The left and right ports can independently access the memory cell array 10. An address signal consisting of bits $A_{0L}$–$A_{nL}$ is applied to a left address buffer 31 via the left port, and some of the bits are transferred to a left-row-decoder 21, which selects a specified row. The remaining bits of the address signal are output to a left-column decoder 23, which selects a specified column. In this manner, at least one specified memory cell becomes electrically connected to a left I/O (Input/Output) circuit 25, and thereby data can be written into or read out from the specified memory cell. Control signals $/CS_L$ and $/WE_L$ applied to the left port control a left I/O buffer 33 and thereby data can be written into or read out from the specified memory cell via the left I/O circuit 25. It will be noted that a "/" denotes a low-active signal and corresponds to a "bar" attached above the top of the reference indicating the signal. With respect to the right port, there are provided a right address buffer 32, a right row decoder 22, a right column decoder 24, a right I/O circuit 26 and a right I/O buffer 34, all which operate in the same manner as the corresponding elements in the left port.

In order to establish the above-mentioned independent memory access operations, each memory cell of the dual-port memory DPM is configured as shown in FIG. 1C. Load elements 12 and 13 are made of, for example, high-resistance polysilicon. MOSFETs (Metal Oxide Semiconductor Field Effect Transistors) 14 and 15 are cross connected to each other. The four structural elements 12–15 form a flip-flop 11, which stores data in the same manner as in the single-port static memory. In the dual-port memory, two data transfer means are connected to the flip-flop 11. More specifically, one of the two gates of the flip-flop is connected to left-port bit lines $BL_L$ and $/BL_L$ via a pair of transistors 16 and 17 connected to a left-port row select line $WL_L$. In the same manner as the above, the other gate of the flip-flop is connected to right-port bit $BL_R$ and $/BL_R$ via a pair of transistors 18 and 19 respectively connected to a right-port row select line $WL_R$. With the above structure, it becomes possible to independently access the memory cell array 10 via the left and right ports.

Generally, in order to transfer data between two devices operating at different bit rates, a rate buffer is provided between the two devices. For example, in order to transfer data processed by the CPU to a printer, a buffer is provided because the bit rate of the CPU is much higher than that of the printer. The buffer temporarily stores data from the CPU, and the stored data is read out therefrom so that the transfer bit rate matches that of the printer. Generally, such a buffer is formed with an FIFO memory.

The FIFO memory is formed as shown in FIG. 1D. The FIFO memory specified by reference numeral 40 comprises of the aforementioned memory cell array 10, a write circuit 41, a write pointer 42, a read circuit 43 and a read pointer 44. A write clock signal /W is input to the write pointer 42, which sequentially generates information indicating the memory cell into which data should be written. That is, the write pointer 42 generates a write address signal in accordance with the write clock signal /W. The write circuit 41 writes input data applied to a terminal Din into the specified memory cell.

A read clock signal /R is input to the read pointer 44, which sequentially generates information showing the memory cell from which data should be read out. That is, the read pointer 44 generates a read address signal in accordance with the read clock signal /R. The read circuit 43 reads data from the memory cell specified by the read pointer 44, and outputs the readout data to a terminal Dout. Reset signals /RST are input to the write pointer 42 and the read pointer 44, which are reset so as to show address "zero" in response to the respective reset signals /RST. Each of the write and read pointers 42 and 44 is formed with a counter, which counts the number of pulses. For example, the write pointer 42 counts the number of pulses contained in the write clock signal /W after it is reset. The read pointer 44 counts the number of pulses contained in the read clock signal /R after it is reset. It will be noted that the read pointer 44 starts to operate after the write pointer 42 starts to operate. With this operation, it is possible to prevent the counter value of the read pointer 44 from exceeding that of the write pointer 42.

A description will now be given, with reference to FIG. 2A, of the write operation of the dual-port memory DPM. In FIG. 2A, parts which are the same as those shown in FIGS. 1A through 1D are given the same reference numerals. Load transistors 51-54 are connected to pairs of bit lines BL and /BL in the respective ports ($BL_L$, $/BL_L$; $BL_R$, $BL_R$), and maintain these bit lines at a predetermined level. Load transistors 59-62 are connected to the pairs of data lines DB and /DB in the respective ports ($DB_L$, $/DB_L$; $DB_R$, $/DB_R$), and maintain these data lines at a predetermined level. Transistors 55-58 for use in column selection are interposed between the pairs of bit lines BL and /BL and the pairs of data lines DB and DB in the respective ports. The transistors 55 and 56 are controlled by a column select signal $Y_L$, and the transistors 57 and 58 are controlled by a column select line $Y_R$. Sense amplifiers (not shown in FIG. 2A for the sake of simplicity) in the read circuit 43 are connected to the respective pairs of data lines, and sense the differences between the respective pairs of data lines. The write circuit 42 is connected to the data lines, and controls the write operation in the memory cells. In order to explain the write operation via the right port with reference to FIG. 2A, only a related write circuit part (comprising of transistors 63-66) is shown in FIG. 2A.

It will now be assumed in FIG. 2A that data "H" is written into a selected cell via the right port and the left port does not select a row on which the write operation is being carried out. That is, a "H"-level signal is applied to the word line $WL_R$, and a "L"-level signal is applied to the word line $WL_L$. In order to write ("H" representing a high output) into the selected cell, "H" is applied to an input node $IN_R$, and ("L" representing a low output) is applied to an input node $/IN_R$. At this time, the transistors 63 and 66 of the write circuit are ON, and the transistors 64 and 65 thereof are OFF. Hence, the level of the data line $DB_R$ switches to "H", and the level of the data line $/DB_R$ switches to "L". The respective levels of the data lines $DB_R$ and $/DB_R$ are transferred to the bit lines $BL_R$ and $/BL_R$ via the transistors 57 and 58, respectively, and hence the levels of the bit lines $BL_R$ and $/BL_R$ switch to "H" and "L", respectively. Hence, a node C of the memory cell 11 switches to "H" and a node /C thereof switches to "L", so that the transistors 15 and 14 are turned ON and OFF, respectively. In this manner, data "H" is written into the memory cell 11. In this state, the level of the bit line $/BL_R$ when it is switched to "L" is a floating level with respect to the ground level due to load currents I1 and I2 from the transistors 54 and 62, respectively. However, there is a slight difference between the floating level and the ground level because normally the transconductance values gm of the load transistors 54 and 62 are set to be smaller than that of the transistor 66 for use in data writing. Generally, such a slight difference is equal to hundreds of millivolts. During the data write operation, the floating level is written into the node /C of the cell via the transfer transistor 19. This floating level is a level which is enough to turn OFF the other cross-coupled transistor 14. Hence, a stable write operation can be carried out.

In the case where the right and left ports select the different rows, data is written into the dual-port memory in the same manner as in the case of the single-port memory. This means that a special problem does not occur. However, a problem will take place if the right and left ports select the same row. This problem will be described below with reference to FIG. 2B.

The operation executed when the same rows are selected via the right and left ports is different from the operation executed when the different rows are selected in that the row select line $WL_L$ in the left port is maintained at the "H" level. Hence, a current is generated which flows from the load transistor 52 connected to the bit line $/BL_L$ of the left port to the node /C of the memory cell via the transfer transistor 17 of the left port. If the right and left ports select not only the same row but also the same column, the column select transistor 56 of the left port is ON, and hence a current flows from the load transistor 60 of the left port to the node /C of the memory cell. The above-mentioned currents flowing to the node /C of the memory cell from the left port are absorbed, through the transfer transistor 19 of the right port and the column select transistor 58 of the right port, by the transistor 66 which is a structural element of the right-port write circuit. In this manner, the transistor 66 of the write circuit must absorb a larger amount of load current when the same column and the same row are selected by the left and right ports. Further, the level of the node /C of the memory cell is a level obtained by dividing the difference between the levels of the bit lines $/BL_L$ and $/BL_R$ by the ratio of the transconductance values of the transistors 17 and 19. Generally, the transistor 17 has the same channel length and channel width as those of the transistor 19. Hence, the level of the node /C is high with respect to the ground level, being equal to, for example, 1.5 V. This level of the node /C does not make the transistor 14 turn OFF, and hence the write operation is unstable.

SUMMARY OF THE INVENTION

It is a general object of the present invention to provide a dual-port semiconductor integrated memory circuit in which the above disadvantage is eliminated.

A more specific object of the present invention is to provide a dual-port semiconductor integrated memory circuit capable of stably writing data into the memory cell array.

The above objects of the present invention are achieved by a dual-port memory circuit comprising a memory cell having a pair of nodes; a first port having a first pair of bit lines and a first word line connected to the memory cell; a second port having a second pair of bit lines and a second word line connected to the memory cell; detection means for detecting that data is written from one of the first and second ports in a state where the memory cell is selected by both the first and second ports; and control means, coupled to the first and second ports and the detection means, for decreasing a potential of one of the nodes in response to a detection output of the detection means.

BRIEF DESCRIPTION OF THE DRAWING

Other objects, features and advantages of the present invention will become more apparent from the following detailed description when read in conjunction with the accompanying drawings, in which:

FIG. 1A is a block diagram of a system having a conventional dual-port memory;

FIG. 1B is a block diagram of the dual-port memory shown in FIG. 1A;

FIG. 1C is a circuit diagram of a memory cell included in the dual-port memory shown in FIG. 1A;

FIG. 1D is a block diagram of an FIFO memory serving as the dual-port memory;

DESCRIPTION OF THE PREFERRED EMBODIMENTS

Figure 3A:
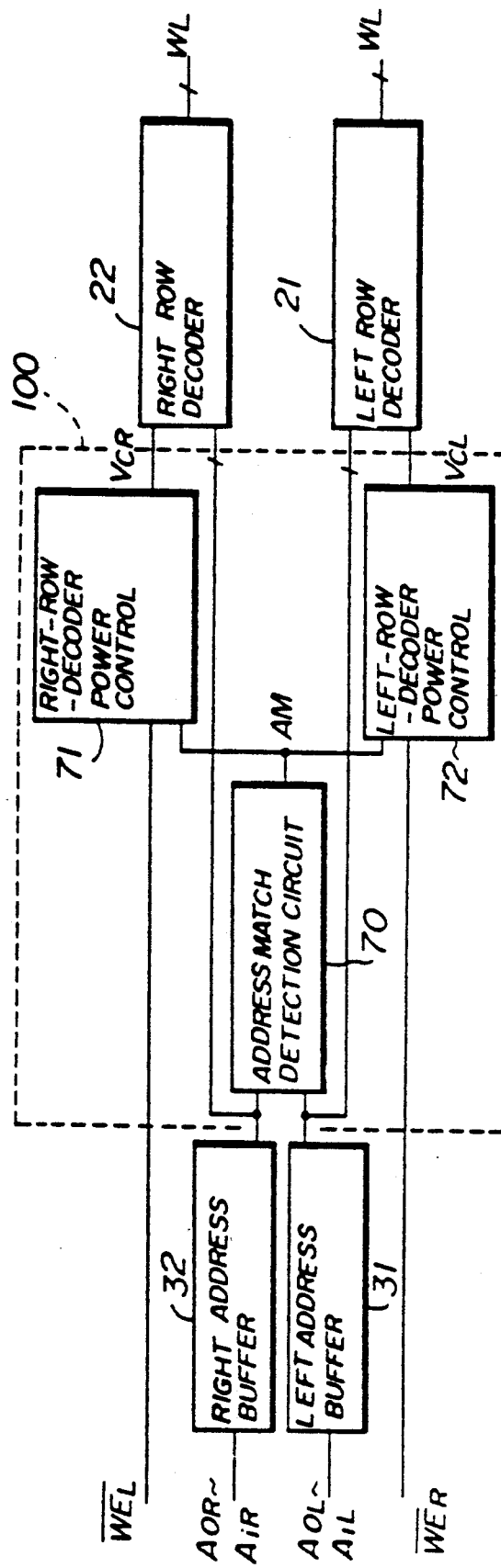
FIG. 3A is a block diagram showing an outline of a first embodiment of the present invention.

FIG. 3A shows an outline of a first embodiment of the present invention. In FIG. 3A, parts which are the same as those shown in the previous figures are given the same reference numerals. According to the first embodiment of the present invention, when the two ports of the dual-port memory select the same rows and data is written into a memory cell array (not shown) via one of the two ports, a select level of a row select line of the other port is decreased to a level between a normal select level and a non-select level at least during a time when the write operation is being carried out. An address match detection circuit 70 shown in FIG. 3A detects a case in which the same row is selected by both the left and right ports. A right-row-decoder power control circuit 71 functions to reduce the select level of the specified right-row select line, and a left-row-decoder power control circuit 72 functions to reduce the select level of the specified left-row select line.

A row address signal comprising address bits $A_{0R}$-$_{iR}$ related to the right port is converted into a MOS-level signal by an address buffer 32. Similarly, a row address signal comprising of address bits $A_{0L}$-$A_{iL}$ related to the left port is converted into a MOS-level signal by an address buffer 31. The MOS-level address signals from the address buffers 31 and 32 are input to the address match detection circuit 70, which determines whether or not the row addresses of the right and left ports match each other. When it is determined that the row addresses of the right and left ports match each other, the address match detection circuit 70 generates an address match detection signal AM, which is output to the right-row-decoder power control circuit 71 and the left-row-decoder power control circuit 72. The circuit 71 receives the address match, detection signal AM and a write control signal /$WE_L$ related to the left port, and outputs a power supply voltage $V_{CR}$ to a right-row decoder 22 in the right port. Similarly, the circuit 72 receives the address match detection signal AM and a write control signal /$WE_R$ related to the right port, and outputs a power supply voltage $V_{CL}$ to a left-row decoder 21. The left-row and right-row decoders 21 and 22 receive the output signals of the address buffers 31 and 32 and the power supply voltages $V_{CL}$ and $V_{CR}$, respectively, and send output signals to the row select lines $WL_R$ and $WL_L$, respectively.

Figure 3B:
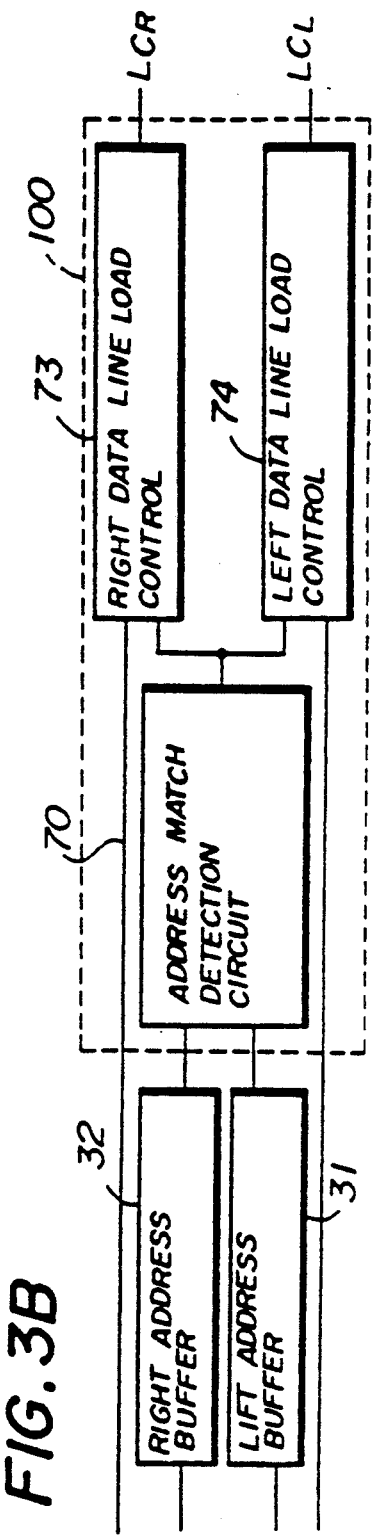
FIG. 3B is a block diagram showing an outline of a second embodiment of the present invention.
Figure 3C:
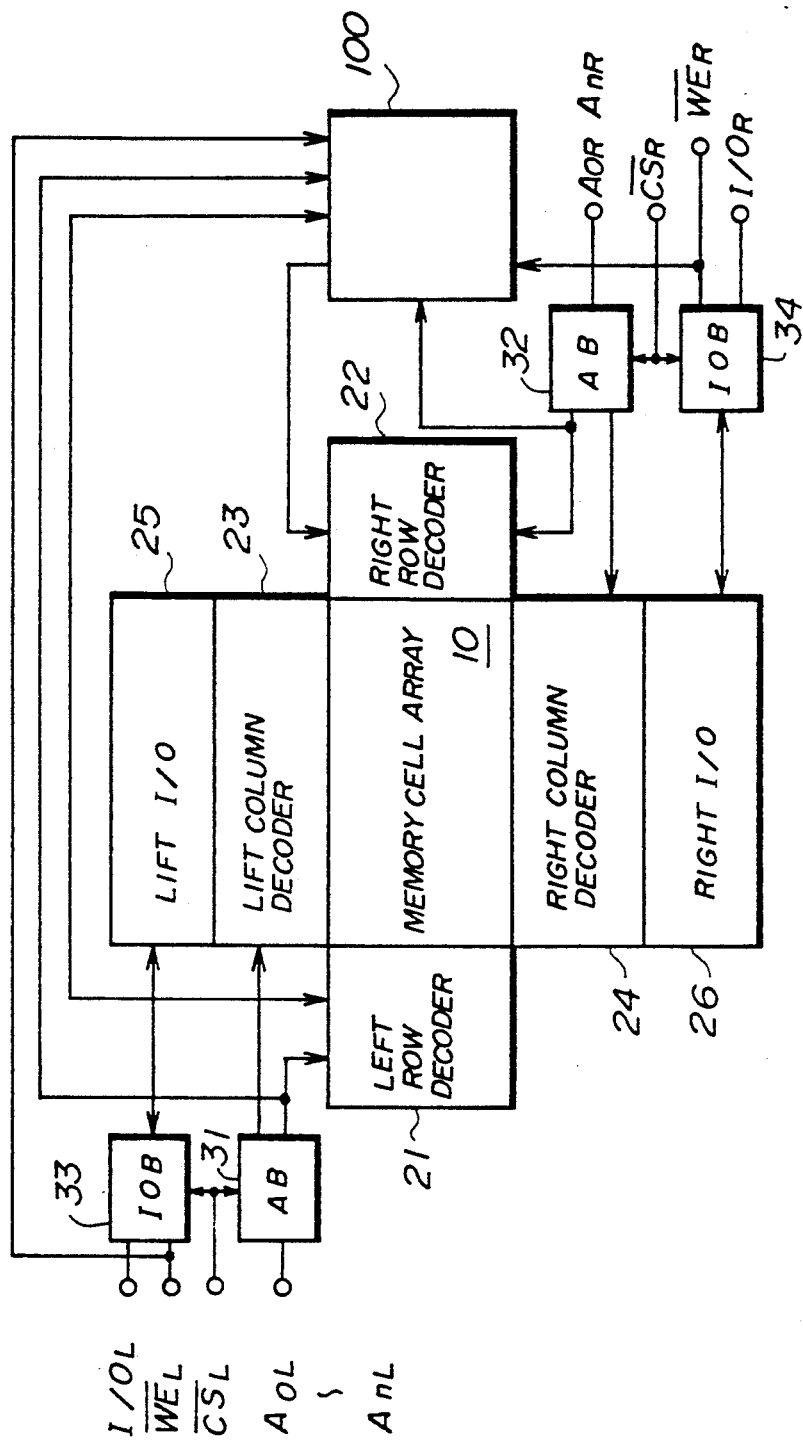
FIG. 3C is a block diagram of the entire structure of a dual port memory according to either the first or second embodiment of the present invention.

FIG. 3C is a block diagram of the entire structure of the dual-port memory according to the first embodiment of the present invention. A block 100 shown in FIG. 3C comprises of the address match detection circuit 70, the right-row-decoder power control circuit 71 and the left-row-decoder power control circuit 72 shown in FIG. 3A.

Figure 4A:
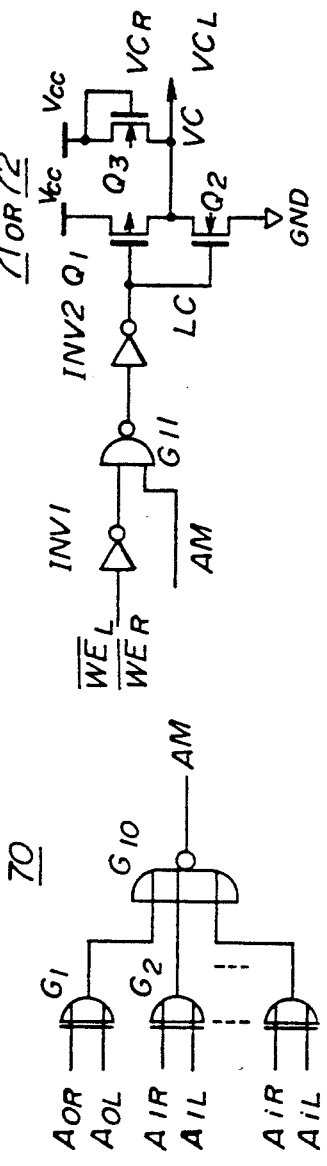
FIGS. 4A through 4D are circuit diagrams of structural parts shown in FIGS. 3A and 3B.

FIG. 4A is a circuit diagram of the address match detection circuit 70. As shown in FIG. 4A, the address match detection circuit 70 comprises of a plurality of exclusive-OR gates (hereafter simply referred to as EORs) G1, G2, ..., and a NOR gate G10. Each of the EOR gates G1, G2, ... receives the respective right-port and left-port address bits ($A_{0R}$, $A_{0L}$), ($A_{1R}$, $A_{1L}$), ... When the right-port and left-port address bits are the same as each other, each of the EOR gates generates "L". When the right-port and left-port address bits are different from each other, each of the EOR gates generates "H". The NOR gate G10 generates "H" when the right-port and left-port address bits in each pair are the same as each other, and generates "L" when the right-port and left-port address bits in at least one pair are different from each other.

Figure 4B:
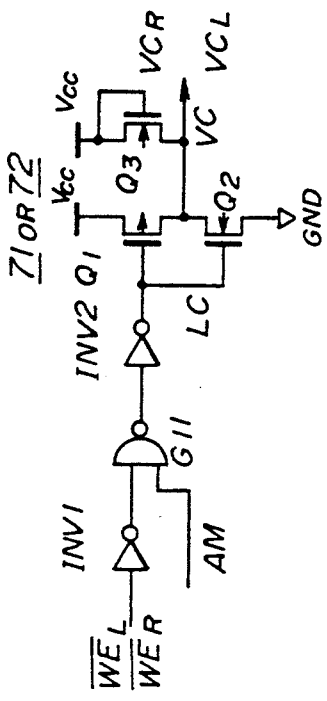

FIG. 4B is a circuit diagram of each of the row-decoder power control circuits 71 and 72. As shown in FIG. 4B, each of the row decoder power control circuits 71 and 72 is comprised of inverters INV1 and INV2, a NAND gate G11, a P-channel FET Q1, and N-channel FETs Q2 and Q3. Each of the circuits 71 and 72 receive the write control signal /$WE_L$ or /$WE_R$, respectively and the address match detection signal AM. When the write control signal is applied while the address match detection signal AM is maintained at "H", an output signal LC of the inverter INV2 switches to "H". At a node where the three FETs Q1–Q3 are connected to one another is an output terminal VC of the row-decoder power control circuit 71 or 72. When the output signal LC of the inverter INV2 is at "L", the transistor Q1 is ON and the transistor Q2 is OFF, and hence the output terminal VC is set to a power supply voltage Vcc. When the output signal LC is at "H", the transistor Q1 is OFF and the transistor Q2 is ON. At this time, the output terminal VC is set to Vcc−Vth by the transistor Q3 which is always ON. It will be noted that Vth is a threshold voltage of the transistor Q3. The transistor Q2 is a low-gm transistor having a narrow channel width and a long channel length. When both the transistors Q2 and Q3 are ON, that is, when the output signal LC of the inverter INV2 is "H", the output terminal VC is set to Vcc−Vth.

Figure 4C:
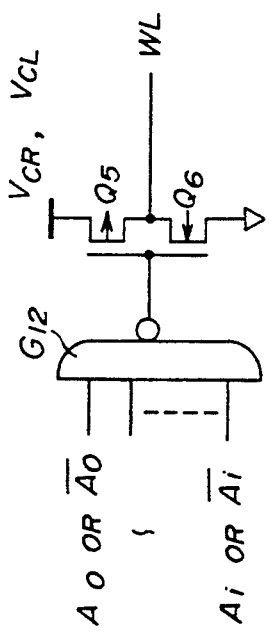

The output voltage VC of the row-decoder power control circuit 71 or 72 is supplied as a power supply voltage of an inverter of the final stage of the row decoder 22 or 21 which selectively drives the row select lines. FIG. 4C shows the inverter of the final stage of each of the row decoder circuits 21 and 22, each of which is comprised of an NAND circuit G12, a P-channel transistor Q5 and an N-channel transistor Q6. The transistors Q5 and Q6 form the final-stage inverter of each of the row decoder circuits 21 and 22. It should be noted that the voltage VC is applied to the inverter instead of the voltage Vcc. The "L" level of the decoder (inverter) is equal to zero volt, but the "H" level thereof is equal to VC, not Vcc. The VC is either Vcc or Vcc−Vth on the basis of the operation state of the memory.

Figure 5A:
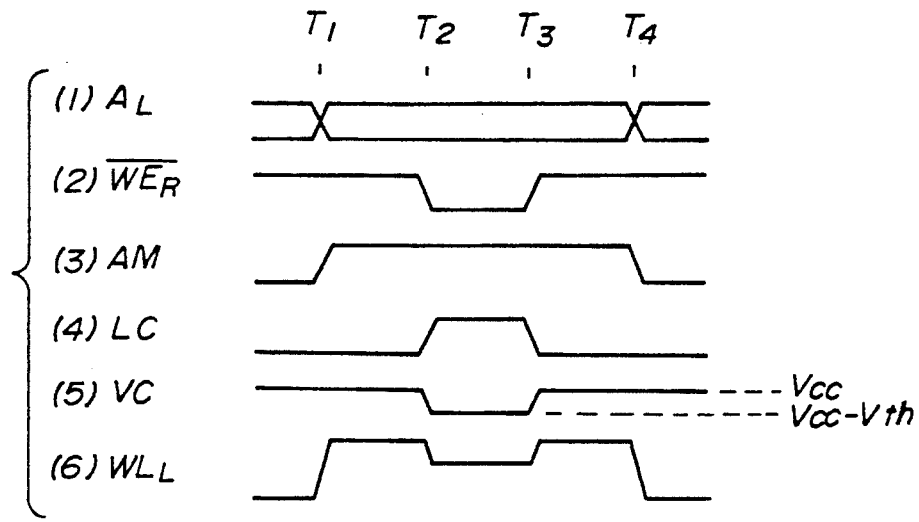
FIG. 5A is a time chart showing the operation of the first embodiment of the present invention.

FIG. 5A is a time chart showing the above-mentioned operation. The operation shown in FIG. 5A shows a case where the address related to the left port is the same as that related to the right port and data is written into the memory via the right port as in the case shown in FIG. 2B. At T1 shown in FIG. 5A, the address applied via the left port changes and becomes identical to the address applied via the right port. At time T2, the write signal is applied to the right port. At time T3, the write operation is completed in the right port. At time T4, the address applied via the left port changes and becomes different from that applied via the right port.

At time T1, the above addresses are different from each other, and hence the address match detection signal AM is at "L", and the output signal LC is also at "L". The output voltage VC obtained at this time is equal to Vcc. At time T1, the address related to the left port changes and becomes identical to that related to the right port. Thus, the address match detection signal AM switches to "H", but the output signal LC is continuously maintained at "L" because the right port has not yet started the write operation. Hence, the output voltage VC is continuously maintained at Vcc. The level of the row select line $WL_L$ selected by the current address switches to Vcc at time T1. At time T2, the right port starts the write operation. In response to this change, the output signal LC switches to "H", and the output voltage VC decreases to Vcc−Vth. In response to this change, the "H" level related to the selected row in the left port decreases to Vcc−Vth. At time T3, the write operation in the right port ends. Hence, the output voltage VC returns to Vcc and the "H" level of the row select line returns to Vcc. At time T4, the address related to the left port changes, and the level of the row select line being considered switches to 0 V, and the address match detection signal AM changes to "L".

A description will now be given of the reason why the write operation can suitably be executed by decreasing the "H" level of the row select line in one port via which data is read out when both the ports select the same row and the other port has switched to the write operation. As has been described with reference to FIG. 2B, when the left and right ports select the same row and data is written via one (right port in the example being considered) of the left and right ports, the level of the node /C of the memory cell is equal to a level obtained by dividing the difference between the levels of $/BL_L$ and $/BL_R$ by the ratio of the transconductance values gm of the transistors 17 and 19. According to the above-mentioned first embodiment of the present invention, the transconductance gm of the transistor 17 is decreased by decreasing the level of the row select line in the port on the read side (that is, the level of $WL_L$). Hence, the level of the node /C is decreased to a level lower than that for the conventional circuit, and hence it becomes easy to turn OFF the cross-coupled transistor 14. As a result, the write operation in the dual-port memory can be stably carried out even under the conditions inherent in the dual-port memory.

A description will now be given of a second embodiment of the present invention with reference to FIG. 3B, which shows an essential part of the second embodiment. According to the second embodiment of the present invention, when the two ports select the same row and data is written into the specified memory cell via one of them, the impedance of the data line load in the other port is increased by a right or left data line load control circuit 73 or 74.

Figure 4D:
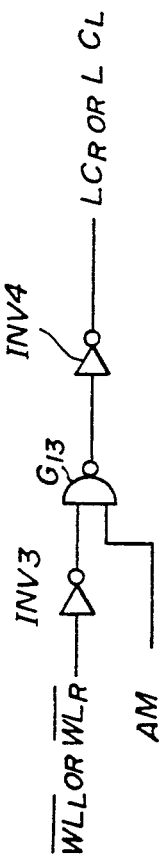

FIG. 4D is a circuit diagram of each of the right and left data line load control circuit 73 and 74. As shown in FIG. 4D, each data line load control circuit is comprised of inverters INV3 and INV4, and a NAND gate G13. Each data line load control circuit receives one of the write control signals $/WE_L$ or $/WE_R$ and the address match detection signal AM, and generates an "H"-level output signal $LC_R$ or $LC_L$ via the output terminal of the inverter INV4 while the address match detection signal AM is active. The output signals $LC_R$ and $LC_L$ of the data line load control circuits 73 and 74 are sent to the right-port and left-port data line loads, which are controlled by these output signals.

Figure 6:
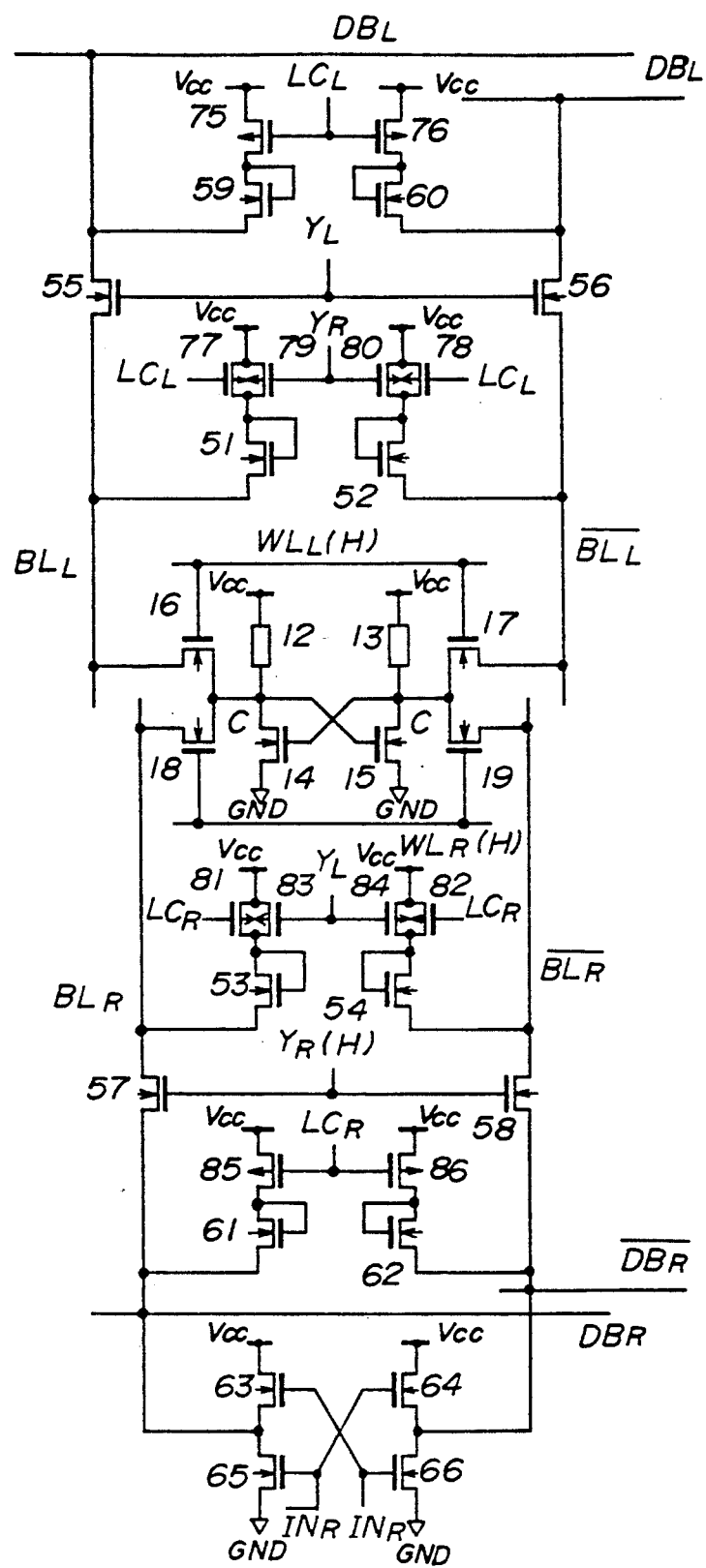
FIG. 6 is a circuit diagram of the second embodiment of the present invention shown in FIG. 3B.

FIG. 6 is a circuit diagram of the structure shown in FIG. 3B. In FIG. 6, parts which are the same as those shown in the previous figures are given the same reference numerals. As shown in FIG. 6, P-channel FETs 77–82, 75, 76, 85 and 86 are connected, in series, to the bit line load circuits 51–54 and data line load circuits 59–62. When the output signal $LC_L$ is at "H", the impedances of the transistors 75, 76, 77 and 78 are increased. When the output signal $LC_R$ is at "H", the impedances of the transistors 81, 82, 85 and 86 are increased. The impedances of the transistors 79 and 80 are increased when the column select signal $Y_R$ in the right port is at "H". The impedances of the transistors 85 and 86 are increased when the column select signal $Y_L$ is at "H".

Figures 2A, 2B:
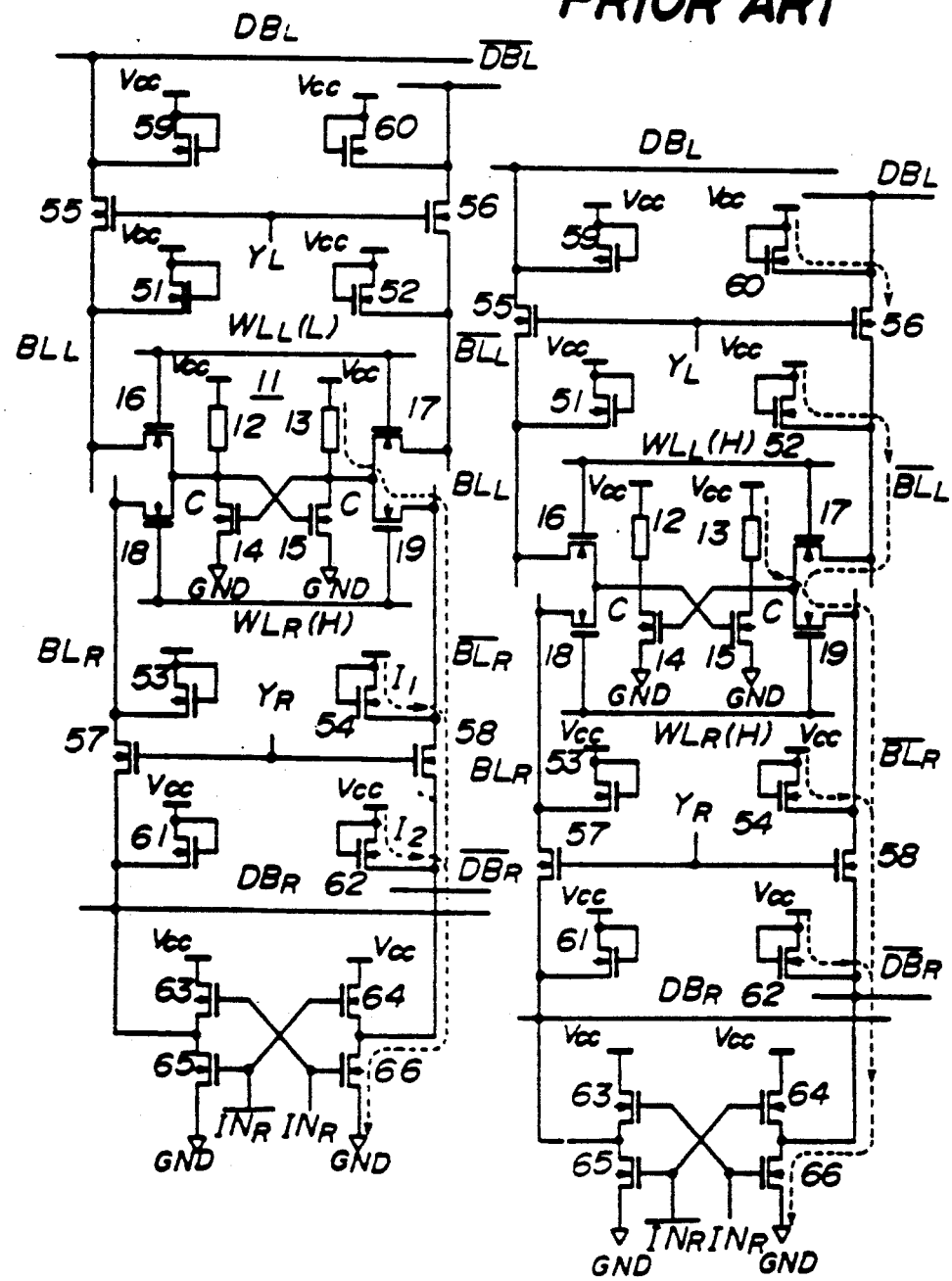
FIG. 2A is a circuit diagram for explaining the operation of the dual-port memory.
FIG. 2B is a circuit diagram for explaining a disadvantage of the conventional dual-port memory.
Figure 5B:
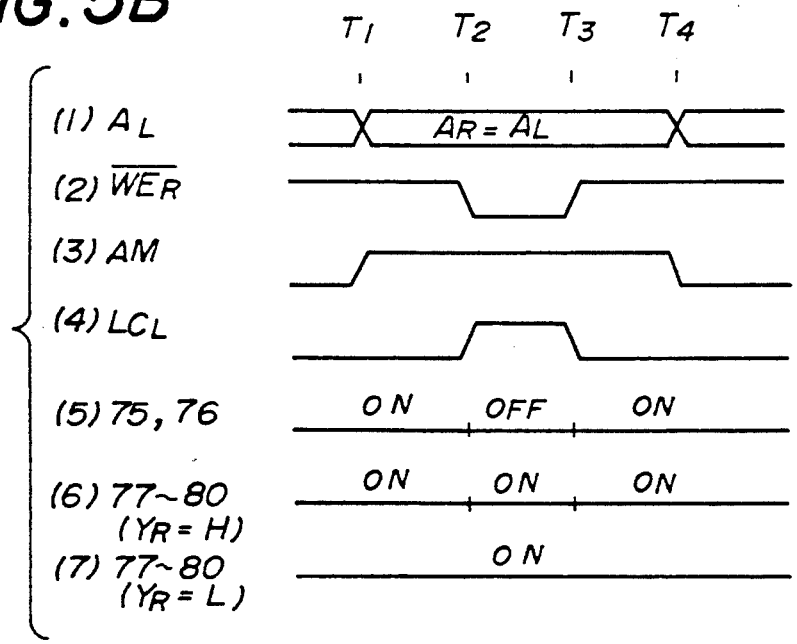
FIG. 5B is a time chart showing the operation of the second embodiment of the present invention.

A description will now be given of the operation of the circuit shown in FIG. 6 with reference to FIG. 5B, which shows an operation executed when the left and right port select the same row and data "H" is written via the right port as in the case shown in FIG. 2B. At time T1, the address applied via the left port changes and at least the row addresses applied via the left and right ports become identical to each other. At time T2, the write signal is applied to the right port. At time T3, the write operation executed via the right port is completed. At time T4, the address applied to the left port changes and becomes different from that applied via the right port.

At time T1, the addresses applied via the right and left ports are different from each other. Hence, the address match detection circuit AM is at "L", and the output signal $LC_L$ is at "L". As a result, the transistors 77 and 78 forming the bit line load circuits and the transistors 75 and 76 forming the data line load circuits are ON, and charges are supplied to the related bit lines and data- lines via the N-channel transistors 51, 52, 59 and 60, respectively. When at least the row addresses applied via the left and right ports become identical to each other at time T1, the address match detection signal AM switches to "H". At time T1, the write operation in the right port has not yet been started, and hence the output signal $LC_L$ is continuously maintained at "L". As a result, the states of the bit line load circuits and the data line load circuits are the same as those at time T1.

At time T2, the write operation in the right port is started. Then, the output signal $LC_L$ switches to "H", and the transistors 77 and 78 forming the bit line load circuits turn OFF. With respect to a column on which the data write operation is executed via the right port, $Y_R$ is at "H", and hence the transistors 79 and 80 of the bit line load circuits in the left port related to the above column are OFF. As a result, all the bit line load circuits in this column are OFF. Hence, there is not a current path in which currents from the transistors 52 and 60 in the left port flow to the write transistor 66 via the transistors 17 and 19, and the level of the node /C of the memory cell is kept low. As a result, a stable write operation can be carried out. Further, the output signal $LC_L$ is at "H", and the transistors 75 and 76 forming the data line load circuits are OFF. Hence, the above current path is not formed even when the same row and same column are selected via the left and right ports. Regarding the columns other than the column on which the write operation is carried out via the right port, $Y_R$ is at "L", and hence the bit line load circuits are ON. As a result, it is possible to prevent the floating states of the bit lines and an unstable write operation. When the write operation in the right port is completed at time T3, the output signal $LC_L$ returns to "L",and the bit line load circuits and the data line load circuits turn ON.

Figure 7A:
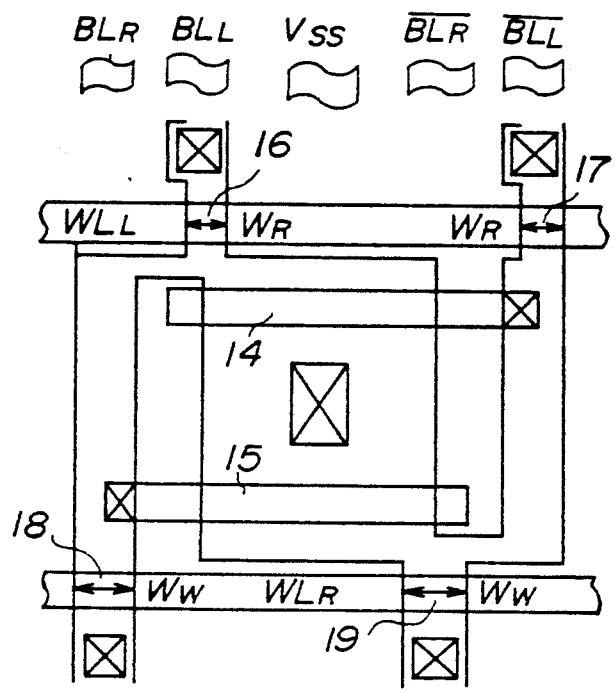
FIGS. 7A through 7D are diagrams showing how to decrease the level of a node of a memory cell.

FIGS. 7A through 7D will now be described. In FIFO memories, it is determined beforehand which port will be used for data writing and which port will be used for data reading. It will now be assumed that the right ports are used for writing data into the memory cell array and the left ports are used for reading out data from the memory cell array. As shown in FIG. 7A, the channel widths of the transfer transistors 16 and 17 for use in data reading, $W_R$, are designed so that they are narrower than the channel widths of the transfer transistors 18 and 19 for use in data writing $W_W$. With this structure, the impedances of the transfer transistors for use in data writing are made smaller than those of the transfer transistors for use in data reading, and the node /C of the memory cell dependent on the ratio of the impedances of these transistors can be set to a lower level.

Figure 7B:
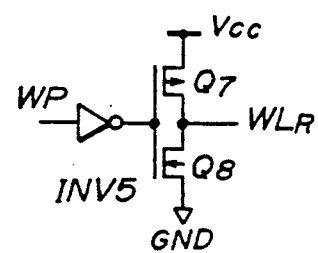
Figure 7C:
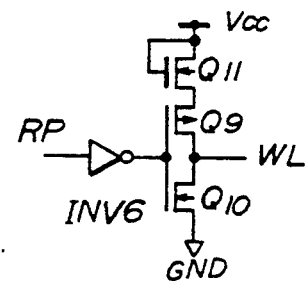
Figure 7D:
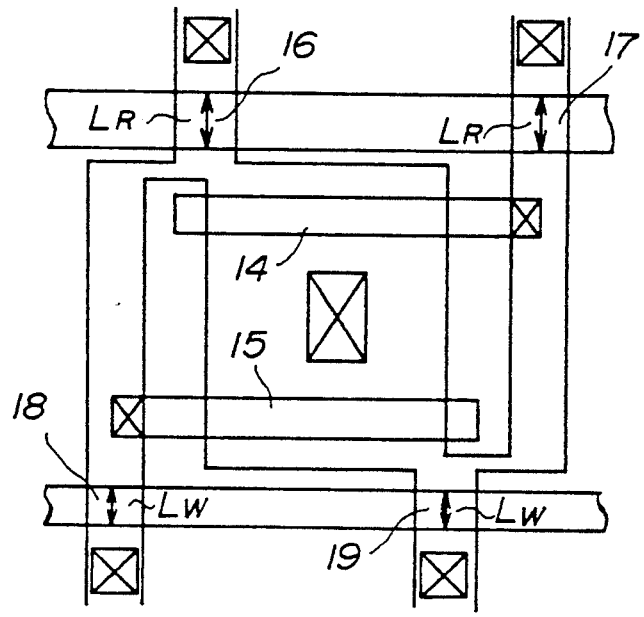

In the structure shown in FIG. 7D, the channel lengths of the transfer transistors for use in data reading, $L_R$, are longer than the channel lengths of the transfer transistors for use in data writing, $L_W$. This structure has the same advantage as that shown in FIG. 7A.

FIGS. 7B and 7C show circuits intended to decrease the level of the node /C without changing the channel length or width. FIG. 7B shows the circuit on the write side (right-port side), and FIG. 7C shows the circuit on the read side (left-port side). Transistors Q7 and Q8 shown in FIG. 7B form a CMOS inverter, and transistors Q9 and Q10 form a CMOS inverter. The circuits shown in FIGS. 7B and 7C form word line drivers of the row decoder. As shown in FIG. 7C, a diode-connected transistor Q11 is connected to the CMOS inverter in series. When the word line is selected, the write pointer 42 and the read pointer 44 shown in FIG. 1D output the "H"-level signals, which are inverted by inverters INV5 and INV6, respectively. Thereby, the transistors Q7 and Q9 are turned ON, and the transistors Q8 and Q10 are turned OFF. As a result, the word lines $WL_R$ and $WL_L$ switch to "H". However, the transistor Q11 is provided on the read side (left-port side), and hence $WL_R = Vcc$ and $WL_L = Vcc - Vth$. As the select level of the word line decreases, the impedance of the transfer transistor increase. Thus, the same effect as that shown in FIG. 7A or 7D can be obtained.

The present invention is not limited to the specifically disclosed embodiments, and variations and modifications may be made without departing from the scope of the present invention.

What is claimed is:

1. A dual-port memory circuit comprising:
    a memory cell having a pair of nodes, said pair of nodes controlling data transfer to and from said memory cell;
    a first port having a first pair of bit lines and a first word line connected to said memory cell, each one of said first pair of bit lines connected to a corresponding one of said pair of nodes;
    a second port having a second pair of bit lines and a second word line connected to said memory cell, each one of said second pair of bit lines connected to a corresponding one of said pair of nodes;
    detection means for detecting that one of the first and second port is writing data to said memory cell and the other one of the first and second ports is reading data from said memory cell in a state wherein the memory cell is selected by both the first and second ports and, in response, generating a match signal; and
    control means, coupled to said first and second ports and said detection means, for decreasing a potential of one of said pair of nodes in response to said match signal of said detection means.

2. A dual-port memory circuit as claimed in claim 1, wherein said control means comprises means for setting one of the first and second word lines of said respective one of the first and second ports which is reading data from said memory cell during said state to a level between a word line select level and a word line non-select level.

3. A dual-port memory circuit as claimed in claim 1, wherein said control means comprises means for increasing impedance values of one of the first and second pairs of bit lines of said respective one of the first and second ports which is reading data from said memory cell during said state.

4. A dual-port memory circuit as claimed in claim 1, wherein:
    said dual-port memory circuit comprises a first pair of data lines coupled to said first pair of bit lines, and a second pair of data lines coupled to said second pair of bit lines; and
    said control means comprises means for increasing impedance values of one of the first and second pairs of data lines which is coupled to the other one of the first and second ports.

5. A dual-port memory circuit as claimed in claim 1, further comprising:
    a first pair of data lines coupled to said first pair of bit lines;
    a second pair of data lines coupled to said second pair of bit lines; and
    said control means further comprising means for increasing impedance values of one of the first and second pairs of bit lines of said respective one of the first and second ports which is reading data from said memory cell during said state and for increasing impedance values of one of the first and second pairs of data lines coupled to said respective one of the first and second bit lines with said increased impedance values.

6. A dual-port memory circuit as claimed in claim 1, further comprising:
    a first impedance circuit coupled to said first pair of bit lines;
    a second impedance circuit coupled to said second pair of bit lines;

the first port being a read port which reads out data from the memory cell via the first pair of bit lines;

the second port being a write port which writes data into the memory cell via the second pair of bit lines; and means for controlling a first impedance value of said first impedance circuit when said read port reads out data from the memory cell and controlling a second impedance value of said second impedance circuit when said write port writes data into the memory cell so that said first impedance value is larger than said second impedance value.

7. A dual-port memory circuit as claimed in claim 1, wherein:

the first port is a read port which reads out data from the memory cell via the first pair of bit lines;

the second port is a write port which writes data into the memory cell via the second pair of bit lines;

said memory cell comprises first and second transfer transistors coupled between the first pair of bit lines and the first word line, and third and fourth transfer transistors coupled between the second pair of bit lines and the second word line; and impedance values of the third and fourth transistors are smaller than those of the first and second transistors.

8. A dual-port memory circuit as claimed in claim 1, wherein:

the first port is a read port which reads out data from the memory cell via the first pair of bit lines;

the second port is write port via which writes data into the memory cell via the second pair of bit lines;

said memory cell comprises first and second transfer transistors coupled between the first pair of bit lines and the first word line, and third and fourth transfer transistors coupled between the second pair of bit lines and the second word line; and each of the first and second transistors has a channel width smaller than that of each of the third and fourth transistors.

9. A dual-port memory circuit as claimed in claim 1, wherein:

the first port is a read port which reads out data from the memory cell via the first pair of bit lines;

the second port is a write port via which writes data into the memory cell via the second pair of bit lines;

said memory cell comprises first and second transfer transistors coupled between the first pair of bit lines and the first word line, and third and fourth transfer transistors coupled between the second pair of bit lines and the second word line; and each of the first and second transistors has a channel length longer than that of each of the third and fourth transistors.

10. A dual-port memory circuit as claimed in claim 1, wherein:

the first port is a read port which reads out data from the memory cell via the first pair of bit lines;

the second port is a write port which writes data into the memory cell via the second pair of bit lines;

said memory cell comprises first and second transfer transistors coupled between the first pair of bit lines and the first word line, and third and fourth transfer transistors coupled between the second pair of bit lines and the second word line; and each of the first and second transistors receives, via the first word line, a gate level lower than that of each of the third and fourth transistors when the first pair of the bit lines is selected.

11. A dual-port memory circuit comprising:

a memory cell having a pair of nodes, said pair of nodes controlling data transfer to and from said memory cell;

a first port having a first pair of bit lines and a first word line connected to said memory cell, each one of said first pair of bit lines connected to a corresponding one of said pair of nodes;

a second port having a second pair of bit lines and a second word line connected to said memory cell, each one of said second pair of bit lines connected to a corresponding one of said pair of nodes;

detection means for detecting that said first port is writing data to said memory cell and said second port is reading data from said memory cell in a state wherein the memory cell is selected by both the first and second ports and in response, generating a match signal;

control means, coupled to said first and second ports and said detection means, for decreasing a potential of one of the pair of nodes in response to said match signal of said detection means; and said control means comprising means for setting the second word line to a level between a word line select level and a word line non-select level during said state.

12. A dual-port memory circuit comprising:

a memory cell having a pair of nodes, said pair of nodes controlling data transfer to and from said memory cell;

a first port having a first pair of bit lines and a first word line connected to said memory cell, each one of said first pair of bit lines connected to a corresponding one of said pair of nodes;

a second port having a second pair of bit lines and a second word line connected to said memory cell, each one of said second pair of bit lines connected to a corresponding one of said pair of nodes;

detection means for detecting that said first port is writing data to said memory cell and said second port is reading data from the memory cell in a state wherein the memory cell is selected by both the first and second ports and, in response, generating a match signal;

control means, coupled to said first and second ports and said detection means, for decreasing a potential of one of the nodes in response to said match signal of said detection means; and said control means comprising means for increasing impedance values of said second pair of bit lines during said state.

13. A dual-port memory circuit comprising:

a memory cell having a pair of nodes, said pair of nodes controlling data transfer to and from said memory cell;

a first port having a first pair of bit lines and a first word line connected to said memory cell, each one of said first pair of bit lines connected to a corresponding one of said pair of nodes;

a second port having a second pair of bit lines and a second word line connected to said memory cell, each one of said second pair of bit lines connected to a corresponding one of said pair of nodes;

detection means for detecting that one of the first and second ports is writing data to said memory cell and the other one of the first and second ports is reading data from said memory cell in a state wherein the memory cell is selected by both the first and second ports and, in response, generating a match signal;

control means, coupled to said first and second ports and said detection means, for decreasing a potential of one of the nodes in response to said match signal of said detection means;

a first pair of data lines coupled to said first pair of bit lines;

a second pair of data lines coupled to said second pair of bit lines; and said control means comprising means for increasing impedance values of one of the first and second pairs of data lines which is coupled to the other one of the first and second ports.

14. A dual-port memory circuit comprising:

a memory cell having a pair of nodes, said pair of nodes controlling data transfer to and from said memory cell;

a first port having a first pair of bit lines and a first word line connected to said memory cell, each one of said first pair of bit lines connected to a corresponding one of said pair of nodes, said first port being a read port which reads out data from the memory cell via the first pair of bit lines;

a second port having a second pair of lines and a second word line connected to said memory cell, each one of said second pair of bit lines connected to a corresponding one of said pair of nodes, said second port writing data into the memory cell via the second pair of bit lines;

detection means for detecting that one of the first and second ports is writing data to said memory cell and the other one of the first and second port is reading data from said memory cell in a state wherein the memory cell is selected by both the first and second ports and, in response, generating a match signal; and control means, coupled to said first and second ports and said detection means, for decreasing a potential of one of the nodes in response to said match signal of said detection means;

said memory cell further comprising first and second transfer transistors coupled between the first pair of bit lines and the first word line, and third and fourth transfer transistors coupled between the second pair of bit lines and the second word line; and each of the first and second transistors having a channel width smaller than that of each of the third and fourth transistors.

15. A dual-port memory circuit, comprising:

a memory cell having a pair of nodes, said pair of nodes controlling data transfer to and from said memory cell;

a first port having a first pair of bit lines and a first word line connected to said memory cell, each one of said first pair of bit lines connected to a corresponding one of said pair of nodes;

a second port having a second pair of bit lines and a second word line connected to said memory cell, each one of said second pair of bit lines connected to a corresponding one of said pair of nodes;

detection means for detecting a state wherein said first and second ports select said memory cell simultaneously;

said first port writing data to said memory cell and said second port reading data from said memory cell during said state; and control means, coupled to said first and second ports and said detection means, for decreasing a potential of one of said pair of nodes during said state wherein said first port is writing data to said memory cell and said second port is reading data from said memory cell.

16. The dual-port memory circuit as claimed in claim 15, wherein said control means comprises means for setting said second word line to a level between a word line select level and a word line non-select level during said state wherein said first port is writing data to said memory cell and said second port is reading data from said memory cell.

17. The dual-port memory circuit as claimed in claim 15, wherein said control means comprises means for increasing impedance values of said second pair of bit lines during said state wherein said first port is writing data to said memory cell and said second port is reading data from said memory cell.

18. A dual-port memory circuit, comprising:

a memory cell having a pair of nodes, said pair of nodes controlling data transfer to and from said memory cell;

a first port having a first pair of bit lines and first word line connected to said memory cell, each one of said first pair of bit lines connected to a corresponding one of said pair of nodes, said first port transmitting a write control signal;

a second port having a second pair of bit lines and a second word line connected to said memory cell, each one of said second pair of bit lines connected to a corresponding one of said pair of nodes;

detection means for detecting a state wherein said first and second ports select said memory cell simultaneously and, in response, generating a match signal;

said first port writing data to said memory cell and said second port reading data from said memory cell during said state; and control means, coupled to said first and second ports and said detection means, for decreasing a potential one of said pair of nodes in response to said write control signal of said first port and said match signal.

19. The dual-port memory circuit as claimed in claim 15, wherein said control means comprises means for setting said second word line to a level between a word line select level and a word line non-select level during said state wherein said first port is writing data to said memory cell.

* * * * *

UNITED STATES PATENT AND TRADEMARK OFFICE
CERTIFICATE OF CORRECTION

PATENT NO. : 5,317,536
DATED : May 31, 1994
INVENTOR(S) : Keizo AOYAMA

It is certified that error appears in the above-indentified patent and that said Letters Patent is hereby corrected as shown below:

Column 2, line 41, delete "of";

Column 3, line 35, after "write" insert --"H"--;

Column 3, line 37, after "and" insert --"L"--;

Column 6, line 15, delete "of" (first occurrence).

Signed and Sealed this

Twenty-eight Day of February, 1995

Attest:

BRUCE LEHMAN

Attesting Officer

Commissioner of Patents and Trademarks